United States Patent
Maggioni et al.

(10) Patent No.: US 11,769,668 B2
(45) Date of Patent: Sep. 26, 2023

(54) P+ OR N+ TYPE DOPING PROCESS FOR SEMICONDUCTORS

(71) Applicant: ISTITUTO NAZIONALE DI FISICA NUCLEARE (INFN), Frascati (IT)

(72) Inventors: Gianluigi Maggioni, Frascati (IT); Davide De Salvador, Padua (IT); Daniel Ricardo Napoli, Frascati (IT); Enrico Napolitani, Padua (IT)

(73) Assignee: ISTITUTO NAZIONALE DI FISICA NUCLEARE (INFN), Frascati (IT)

( * ) Notice: Subject to any disclaimer, the term of this patent is extended or adjusted under 35 U.S.C. 154(b) by 0 days.

(21) Appl. No.: 17/919,971

(22) PCT Filed: Apr. 20, 2021

(86) PCT No.: PCT/EP2021/060183
§ 371 (c)(1),
(2) Date: Oct. 19, 2022

(87) PCT Pub. No.: WO2021/214028
PCT Pub. Date: Oct. 28, 2021

(65) Prior Publication Data
US 2023/0170219 A1 Jun. 1, 2023

(30) Foreign Application Priority Data
Apr. 22, 2022 (IT) .................. 102020000008662

(51) Int. Cl.
*H01L 21/268* (2006.01)
*H01L 31/18* (2006.01)
*H01L 21/225* (2006.01)

(52) U.S. Cl.
CPC ........ *H01L 21/2254* (2013.01); *H01L 21/268* (2013.01); *H01L 31/1808* (2013.01); *H01L 31/1872* (2013.01)

(58) Field of Classification Search
CPC ............... H01L 21/2254; H01L 21/268; H01L 31/1808; H01L 31/1872
See application file for complete search history.

(56) References Cited

U.S. PATENT DOCUMENTS

| | | | |
|---|---|---|---|
| 6,368,947 B1 | 4/2002 | Yu | |
| 7,799,666 B1 * | 9/2010 | Doudoumopoulos | ..................... H01L 21/2254 438/513 |

(Continued)

FOREIGN PATENT DOCUMENTS

| | | |
|---|---|---|
| EP | 3252800 A1 | 12/2017 |
| WO | 2009020511 A1 | 2/2009 |

(Continued)

OTHER PUBLICATIONS

Usui S et al, "Xeci Excimer Laser-Doping of Silicon Using Phosphorus and Boron Film as a Diffusant Source", Aug. 20, 1986, Aug. 20, 1986 (Aug. 20, 1986), p. 225-228, XP000819462.

(Continued)

*Primary Examiner* — David Vu
*Assistant Examiner* — Brandon C Fox
(74) *Attorney, Agent, or Firm* — Volpe Koenig

(57) ABSTRACT

A p+ or n+ type doping process for semiconductors, allows to implement a semiconductor with a highly doped surface layer, and it comprises the steps of: providing a substrate made of semiconductor material; depositing on a surface of the substrate made of semiconductor material a thin source layer made of dopant material acting as dopant source; depositing on said source layer an additional protective surface layer made of semiconductor material; inducing liquefaction of the surface layer at least until the source layer; and cooling down the substrate surface so as to obtain the diffusion of the dopant material.

16 Claims, 4 Drawing Sheets a)

Figure 1:
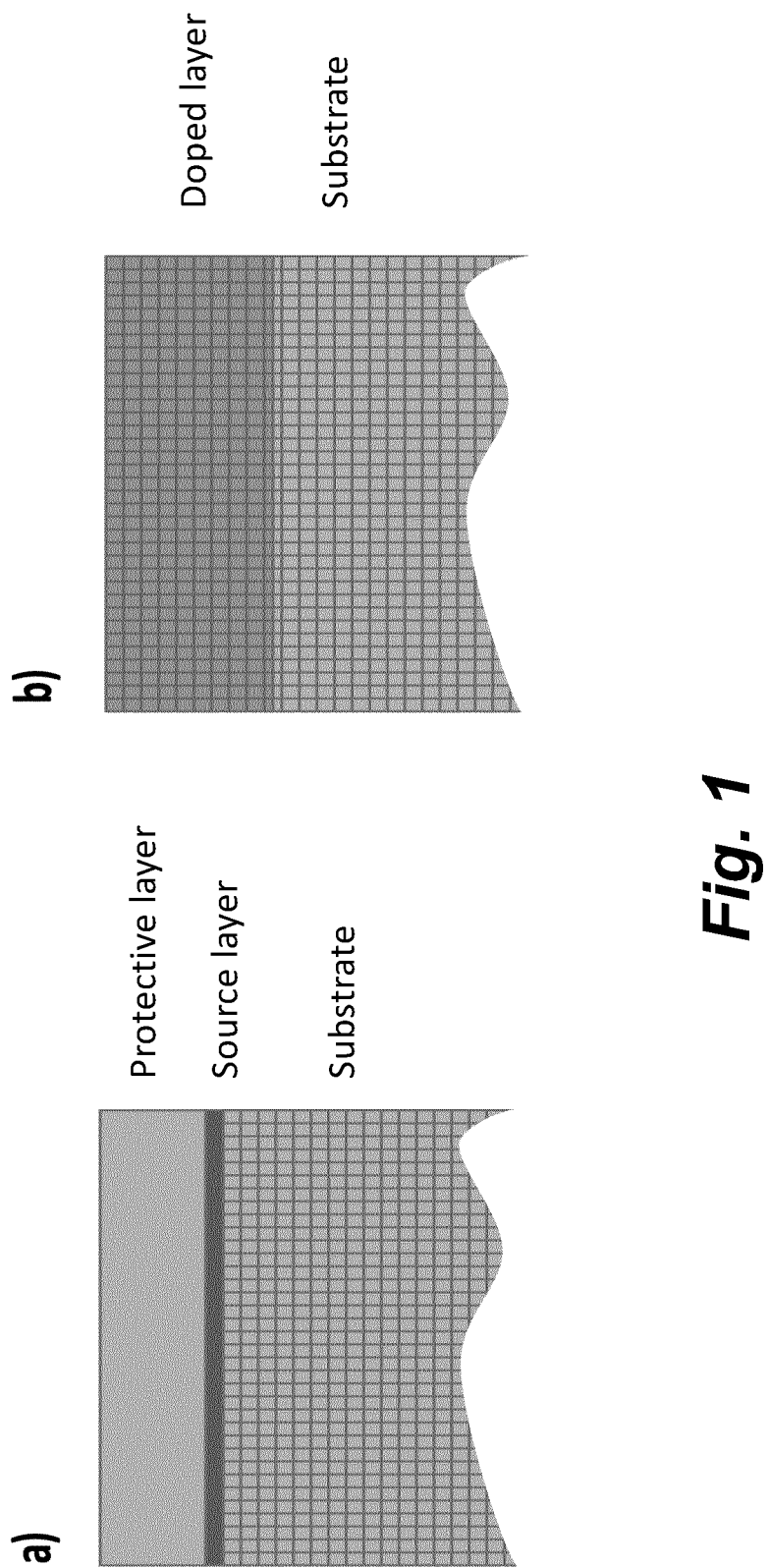

Protective layer
Source layer
Substrate b)

Doped layer
Substrate

(56) References Cited

U.S. PATENT DOCUMENTS

| | | |
|---|---|---|
| 9,613,805 B1 | 4/2017 | Schustereder et al. |
| 2005/0225371 A1 | 10/2005 | Kim et al. |
| 2009/0042376 A1 | 2/2009 | Ma et al. |
| 2009/0176354 A1 | 7/2009 | Rajendran et al. |
| 2010/0255666 A1 | 10/2010 | Yang et al. |
| 2017/0316933 A1 | 11/2017 | Xie et al. |
| 2018/0151361 A1 | 5/2018 | Mazur et al. |

FOREIGN PATENT DOCUMENTS

| | | |
|---|---|---|
| WO | 2009020512 A1 | 2/2009 |
| WO | 2017207653 A1 | 12/2017 |

OTHER PUBLICATIONS

Maggioni G et al, "Pulsed laser diffusion of thin hole-barrier contacts in high purity germanium for gamma radiation detectors", Mar. 5, 2018 (Mar. 5, 2018), vol. 54, No. 3, p. 1-6.

C. Carrara et al., "N+ Type Heavy Doping with Ultralow Resistivity in Ge by Sb Deposition and Pulsed Laser Melting" Applied Surface Science 509 (2019) 145229.

* cited by examiner

P+ OR N+ TYPE DOPING PROCESS FOR SEMICONDUCTORS

The present invention relates to a p+ or n+ type doping process for semiconductors, starting from a substrate made of semiconductor material, in particular but not exclusively Germanium, to implement semiconductors with doped layers of p+ and/or n+ type, which can be used for manufacturing technology devices and systems based thereupon.

In particular, the doping process set forth by the invention relates to the manufacturing of junctions of p+ and n+ type in Germanium-based semiconductors which, according to the state of art, are generally implemented with ion implantation techniques, followed by a treatment of annealing the layer in which the ion implantation was performed, and/or with other high temperature diffusive processes.

By way of example, the most used techniques for implementing a doping of p+ type are based upon the process of dopant ion implantation, in case followed by an annealing treatment, that is a heating aiming at recovering the damage induced by the implantation itself. For example, in the commercial High-Purity Germanium detectors, the doping by p+ contact is implemented with a Boron implantation, and in this case the annealing could not be required.

However, upon performing these known doping techniques (implantation and/or high temperature diffusive processes), several drawbacks are found.

In particular, the methods using the ion implantation often require a subsequent annealing treatment to recover the damage induced by implantation, treatment which not always is compatible with the production processes and/or with the features of the used semiconductor, as it happens when the semiconductor is based upon High-Purity Germanium (mentioned as HPGe).

Another disadvantage is represented by the risk of contamination linked to high temperature processing, both for the recovery of damage from implantation and for diffusion.

Moreover, it is not possible to use for doping dopants sensitive to humidity and/or to the presence of oxygen. In particular, for elements such as Aluminium the formation of oxides ($AlO_x$) may occur, which reduce drastically the electric activation of the doping element.

Then, it is possible to find out-diffusion phenomena of dopant, which generally are undesirable, and not always it is possible to vary the dopant concentration and the contact thickness in a range of values as wide as desired or as requested by the subsequent applications.

At last, in the known processes, the doping is not limited to a surface layer, at least for the n+ junctions in HpGe, and then it is not possible to implement junctions of shallow and/or ultra-shallow type, that is with doping limited to the substrate surface, junctions which would be particularly interesting for applications in micro/nano-electronics.

US patent applications No. 2005/225,371 A1 describes a doping process comprising a laser melting which is used on a particular film structure to obtain a junction wherein the semiconductor has a variable composition. To obtain this, a source of doped polycrystalline silicon dopant is used. The separation between the doping element and the surface does not take place since the polycrystalline silicon, source of the doping element, is always at the surface of a sequence of layers.

US patent application No. 2018/0,151,361 A1, instead, describes a process for the formation of a junction made of Germanium subjected to elastic deformation, wherein the dopant is however introduced by ion implantation.

US patent application No. 2009/0,042,376 A1, International patent applications No. WO 2009/020512 A1, and No. WO 2009/020511 A1 describe processes for activating a dopant inserted in a CMOS device by ion implantation. In this case, the surface layers have the purpose of forming a metal contact, and at least they are partially removed after the process and they do not become integrating portion of the junction. Moreover, the reduction in the interaction with the surface is not mentioned.

U.S. Pat. No. 6,368,947 B1 and the US patent application No. 2010/0,255,666 A1 describe procedures in which laser emissions are not used to form the junction, but protective and sacrificial layers are used, namely layers which are removed before completing the device and which are not used to reduce the dopant interaction with the surface.

US patent application No. 2009/0,176,354 A1 describes a method for doping a portion of amorphous material, which is converted into crystalline material after a laser treatment, or an annealing treatment implemented with electronic beam. In the method the dopant incorporation and the junction formation after crystallization take place in different moments.

Finally, International patent application No. WO 2017/207653 A1 discloses a process for manufacturing a deep junction electronic device wherein inactivated dopant elements are incorporated into a substrate prior to depositing a layer of non-monocrystalline semiconductor material onto the substrate.

The technical problem underlying the present invention is to provide a doping process of p+ or n+ type for semiconductors allowing to obviate the drawback mentioned with reference to the known art.

Such problem is solved by a p+ or n+ type doping process for semiconductors as specified above and as defined in appended claim 1, which comprises the steps of:

- depositing on a surface of the substrate made of semiconductor material a thin source layer made of dopant material acting as dopant source;
- depositing on said thin layer an additional surface layer of semiconductor material;
- inducing liquefaction of the surface layer at least until the source layer so as to obtain the diffusion of the dopant material; and
- cooling down the substrate surface, so as to obtain solidification of the semiconductor material of the surface layer, and in case part of the substrate, with incorporation of the dopant itself.

The process according to the invention allows to implement a semiconductor with a highly doped surface layer.

According to a preferred embodiment example, said liquefaction is implemented by emitting on the substrate surface one or more laser pulses. Moreover, the cooling-down is so as to obtain a crystalline regrowth of the melt semiconductor material, and then the passage from an amorphous structure to a crystalline structure of the surface layer of semiconductor material.

Advantageously, the semiconductor material of the substrate and of the surface layer coincide, and this material preferably is Germanium.

The above-mentioned surface layer, in the process according to the invention, is capable of performing several functions, and in particular it protects the source layer from the surrounding atmosphere, before the diffusion process; it reduces or eliminates the dopant out-diffusion phenomenon during the diffusion process; and it becomes integrating portion of p+ or n+ doping of the substrate without introducing contaminants and without the need for being removed at the end of the diffusion process.

This last effect takes place since, during the liquefaction process, the dopant material also diffuses within the surface layer, which can reconstruct coherently to the substrate.

The use of a laser emission allows an extremely quick heating which avoids heating the substrate and preserves the purity thereof, by avoiding the introduction of highly diffusive contaminants.

At last, the adoption of the above-defined doping process allows a cost reduction with respect to a ion implantation process, the use of dopants sensitive to the surrounding atmosphere, the applicability to a great variety of doping elements, the possibility of varying the dopant concentration and the p+ or n+ contact thickness in a wide range of values, the fact of obtaining a very surface doping, of particular interest for applications in micro/nano-electronics, and of applying this process to several other applications which require the formation of doped layers and thin junctions.

The use of the above-defined doping process is very useful to implement doped layers of any size and geometry on the substrate surface, for example according to point contact, linear, circular contacts, or with depositions on cylindrical, polyhedral surfaces or surfaces with any other shape, substantially without limitations. The geometry advantageously can be defined in one or both of the following process steps: during the deposition of the two source and surface layers, and during the liquefaction process, in particular by using a laser emission.

Figure 3:
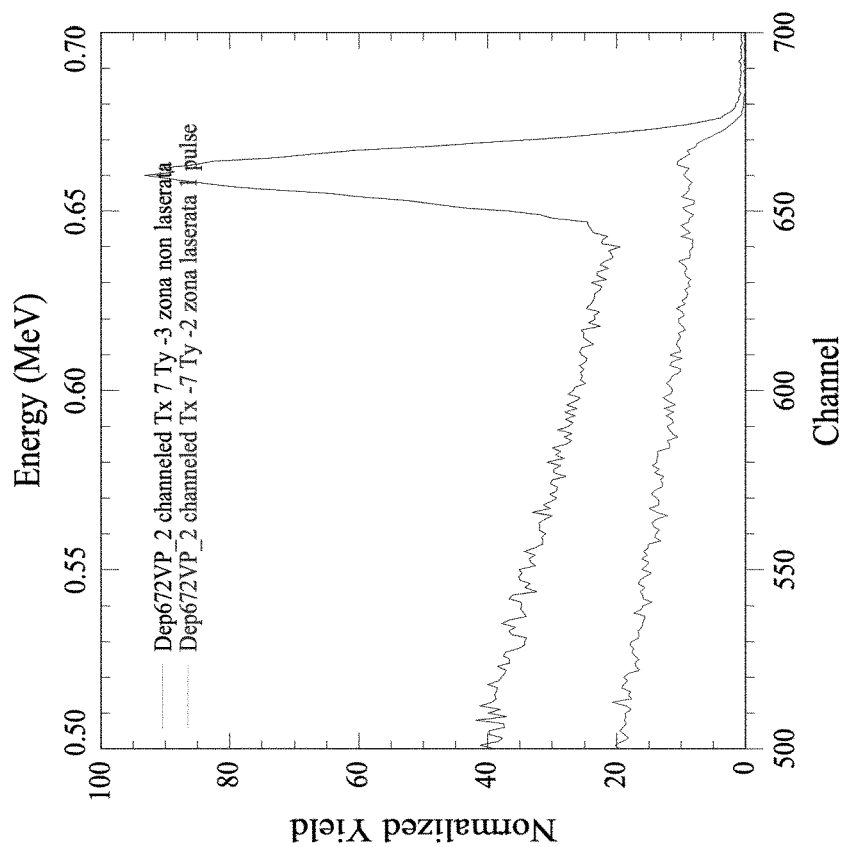
Figure 2:
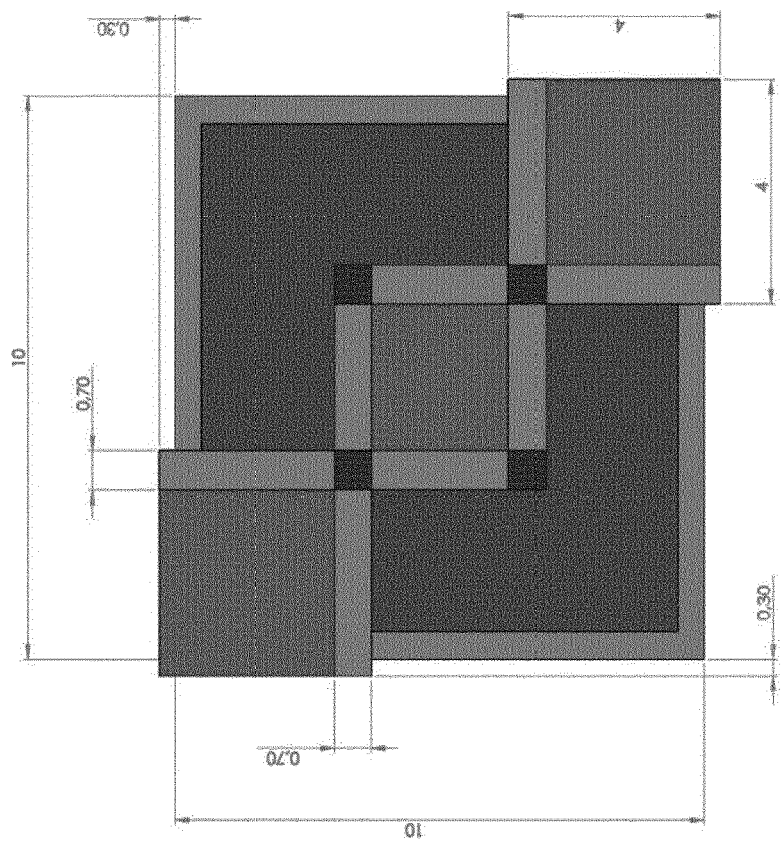
Figure 5:
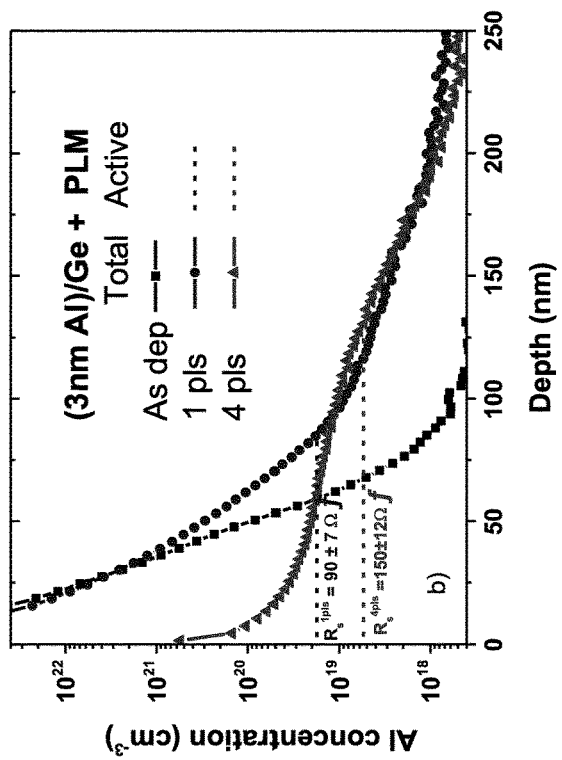
Figure 4:
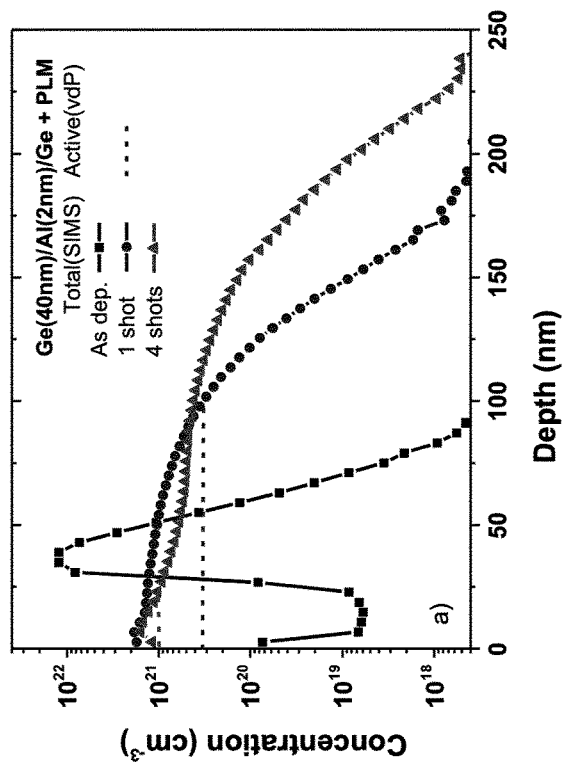
Figure 7:
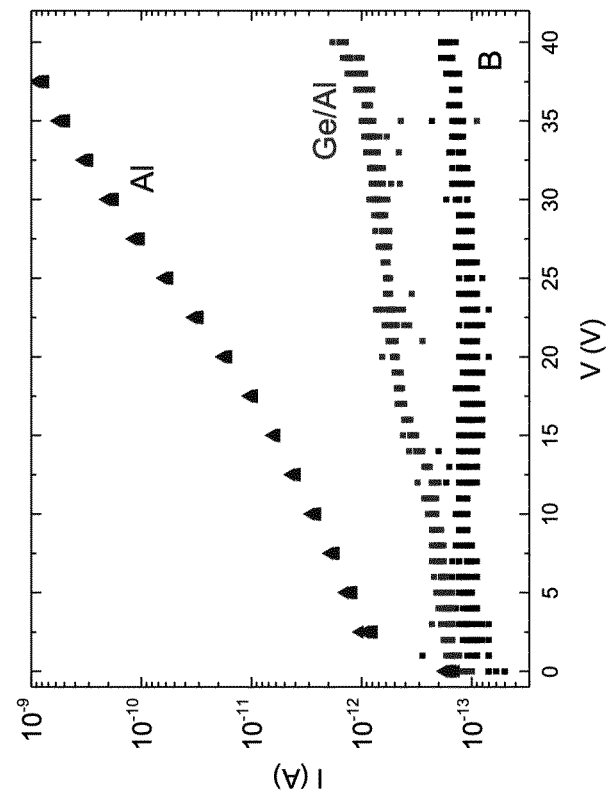
Figure 6:
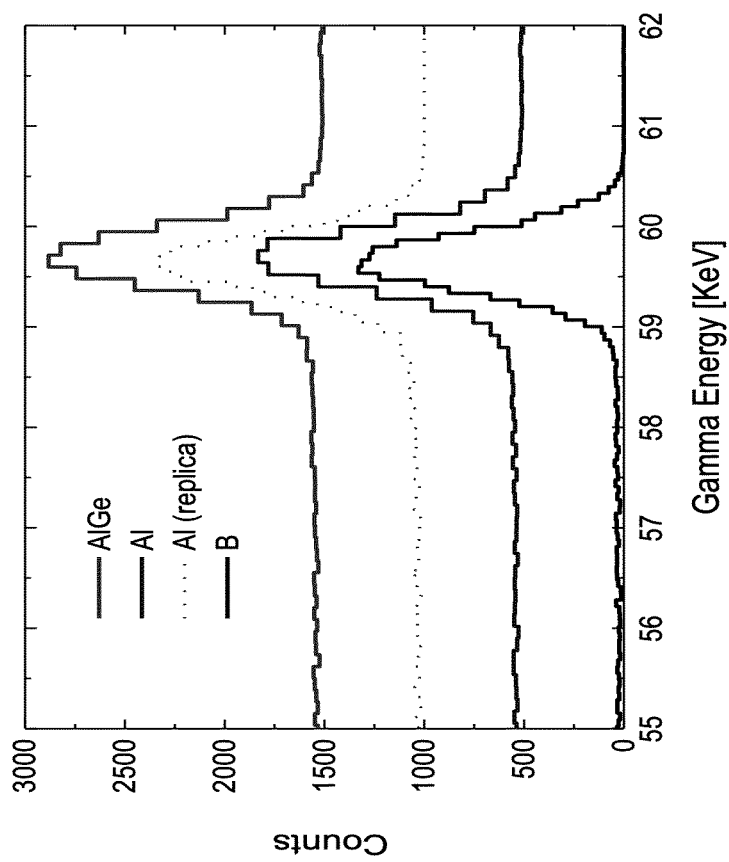

The present invention will be described hereinafter according to a preferred embodiment example thereof, provided by way of example and not with limitative purposes with reference to the enclosed drawings wherein:

FIG. 1 a) schematically shows a structure of the substrate, of the source and of the surface layer before the liquefaction step, and b) schematically shows the structure of the substrate once the cooling step is completed;

FIG. 2 schematically shows a laser emission geometry which can be used in the present process;

FIG. 3 shows a diagram illustrating the Germanium signal under conditions of RBS-channelling before and after the doping process;

FIGS. 4 and 5 show respective diagrams illustrating the measurement of the total concentration and of the active concentration for samples with amorphous protective surface layer (FIG. 4) and without it (FIG. 5) after 1 and 4 laser pulses;

FIG. 6 shows a diagram illustrating the spectrum of a source [241]Am in the photopeak area for different prototypes; and FIG. 7 shows a diagram illustrating the reverse currents for different prototypes.

With reference to the figures, a p+ or n+ type doping process for semiconductors is described, which provides to work on a substrate made of semiconductor material, for example Germanium or Silicon.

In the present embodiment example, the selected semiconductor material is Germanium.

On a surface of the substrate, a deposition of a thin source layer made of dopant material acting as dopant source is performed. Herein and hereinafter, under thin a much lower thickness is meant than the thickness of the substrate and the thickness of the surface layer which will be described hereinafter.

The thickness of the source layer preferably is comprised in a range between 0.1 nm to 20.0 nm, but preferably the higher limit of this range is 4.0 nm.

The aim of the source layer is to provide the dopant material to be diffused in the substrate, by obtaining a semiconductor with doping of p+ or n+ type.

The deposition of the source layer can be performed with a vacuum deposition technique in a vacuum chamber.

The preferred technique for this deposition is sputtering, but also other vacuum deposition techniques, such as evaporation, can be used.

Alternatively, the deposition of step A can be carried out not under vacuum but in a chamber with atmosphere of inert gas (argon, nitrogen) by means of deposition techniques of chemical type, such as spin coating, or dipping.

The preferred dopant material for a doping of p+ type is Aluminium, and in particular the combination between Germanium and Aluminium allows to obtain particularly advantageous semiconductors for the applications which will be described hereinafter.

At last, it is specified that within the protective scope of the present patent embodiments are included wherein the source layer in turn comprises a plurality of layers of doping material in case alternated with layers of semiconductor material. By pure way of example, the case is shown wherein the source layer comprises a plurality of layers of Aluminium alternated with layers of Germanium.

Subsequently, on the source layer an additional surface layer of semiconductor material is put, which advantageously can be the same material used for the substrate, for example Germanium.

The deposition of the surface layer can be performed in the same chamber wherein the previous deposition of the source layer was performed, then in a vacuum chamber or in a chamber with inert atmosphere.

Then, the two depositions can be performed without extracting the substrate from the chamber of the first deposition, and then substantially in one single solution.

This precaution allows to protect the doping layer from the surrounding atmosphere, thus by avoiding impurities such as oxygen or humidity.

For the second deposition, the same technique which was used for the deposition of the source layer can then be used. The surface layer, which advantageously can be made of Germanium, can be amorphous, polycrystalline or crystalline.

The thickness of the surface layer, or protective layer, preferably is comprised in a range between 0.1 nm up to 2.0 µm. The most preferred range for the thickness of the surface layer is from 10 nm to 50 nm.

Once the two above-described depositions are completed, in the process according to the present invention a sudden liquefaction of the surface layer is induced at least until the source layer, by the application of any source of energy, such as a laser, a beam of electrons, or the exposure to a heat source. Preferably, liquefaction of the surface layer has to be completed within a limit time of 400 ns.

According to the present embodiment example, this liquefaction is carried out by emitting, on the substrate surface, a laser pulse, in particular a laser pulse in the UV field and in the visible light field, allowing an extremely quick heating and avoiding the heating of the underlying substrate, by preserving the purity thereof and avoiding the insertion of highly diffusive contaminants.

During the liquefaction process, the dopant material also diffuses within the surface layer, which can reconstruct coherently to the substrate.

Advantageously, the duration of the laser pulse is lower than 200 ns, whereas the wavelength of the laser pulse is comprised in a range between 200 nm e 700 nm, but advantageously the upper limit of this range is 400 nm.

Once the surface layer is liquefied, in this way causing the diffusion of the dopant material, it is cooled down to obtain the final layer of doped material. This cooling step will involve the surface layer and in case even the substrate portion which has liquefied in the liquefaction step; it can take place in controlled way, by heating or cooling down the material with suitable means, for example ventilation, or by leaving that it cools down naturally.

By means of the liquefaction step, the doping, that is the diffusion of the dopant material, could take place by involving the whole thickness of the surface protective layer, that is until the external surface of the resulting semiconductor.

However, it is possible that the diffusion does not reach such surface, and that then the so-called buried doped layer is obtained, within the final semiconductor.

Preferably, the cooling down is so as to obtain a crystalline regrowth of the melt semiconductor material, and then the passage from a possible starting amorphous structure, which is the most convenient to be put, to a crystalline structure of the surface layer of semiconductor material, coherent with the crystalline structure of the substrate.

In order to investigate the manufacturing of the semiconductor obtained with the above-described process, different types were produced which were tested as detectors of gamma radiations, and the performances thereof were compared.

In particular, semiconductor junctions with n+ doping on the surface opposite to that of the p+ doping were produced.

The n+ doping was obtained by using Antimony (Sb) as doping material, whereas the p+ doping was obtained by using Aluminium (Al) as doping material, with a substrate made of Germanium (Ge).

Moreover, the geometry of n+ junction is the same for all prototypes and it is the one reported in FIG. 1b), with the presence of a guard ring around the circular central contact. Therefore, the prototypes differentiate only in the procedure for preparing the p+ junction.

Therefore, an operating prototype was implemented consisting in a planar diode based upon High-Purity Germanium, wherein the p+ contact was obtained with the above-described process. In particular, the p+ contact was implemented by using as surface layer amorphous Germanium.

Two different Wafers made of monocrystalline Germanium (Umicore) were used as substrates for the experimental tests:
  (i) a first high resistivity wafer ($\rho \geq 40$ $\Omega$cm) polished chemically or mechanically having a thickness of 0.5 mm (HRGe) was used as prototype for measurements SIMS, RBS and for electrical measurements;
  (ii) a wafer of n type, with thickness of 2.0 mm of High-Purity Germanium (HPGe), that is with a concentration of doping impurity atoms equal to $(0.93 \pm 0.03) \times 10^{10}$ per $cm^3$, with cut surfaces, used as prototype for radiation detectors.

After a manual polishing of both sides of wafer (ii), it was cut into samples $10 \times 10$ $mm^2$ by using an automatic cutting machine (Disco Corporation, Tokyo, Japan) and subsequently by performing a cleaning with heated 2-propanole, heated deionized water and hydrofluoric acid to remove the residues of cutting adhesive and native oxides. The squared substrates made of HPGe then were chemically dipped into a solution 3:1 of $HNO_3$ 65%:HF 40% (all reagent grade acids, Carlo Erba Reagents srl) for a period from 5 to 7 minutes to remove the mechanically damaged surface layer.

The chemical erosion caused a decrease in the thickness of the substrate of $1.95 \pm 0.05$ mm. In case of detector prototypes, n+ junctions were produced on a surface of squared samples made of HPGe according to the procedure described in:

G. Maggioni, S. Carturan, W. Raniero, S. Riccetto, F. Sgarbossa, V. Boldrini, R. Milazzo, D. R. Napoli, D. Scarpa, A. Andrighetto, E. Napolitani, D. De Salvador, *Pulsed laser diffusion of thin hole-barrier contacts in high purity germanium for gamma radiation detectors*, Eur. Phys. J. A. 54 (2018). https://doi.org/10.1140/epja/i2018-12471-0; e C. Carraro, R. Milazzo, F. Sgarbossa, D. Fontana, G. Maggioni, W. Raniero, D. Scarpa, L. Baldassarre, M. Ortolani, A. Andrighetto, D. R. Napoli, D. De Salvador, E. Napolitani, N+ *Type Heavy Doping with Ultralow Resistivity in Ge by Sb Deposition and Pulsed Laser Melting*, Appl. Surf. Sci. 509 (2019) 145229. https://doi.org/10.1016/j.apsusc.2019.145229.

A 2-nm-thick film made of Antimony was deposited by sputtering, and this film was subjected to a laser-annealing step.

With the purpose of comparing between the process according to the invention and a conventional ion implantation process, one of the three HPGe detectors was subjected to a Boron implantation (23 keV, $1 \times 10^{15}$ per $cm^2$) on the opposite side to implement an electronic barrier of p+ junction.

The p+ contact in the other two detectors made of HPGe was implemented with two procedures on two respective samples:
  i) the first procedure provides the deposition of a film of few nm of Aluminium by sputtering, then subjected to laser-annealing;
  ii) the second procedure provides the deposition of a double layer of aluminium, with a thickness of few nm, and of Germanium, with a thickness of 40 nm, then subjected to laser-annealing.

All layers of Antimony (Sb), Aluminium (Al) and Germanium (Ge) were deposited by sputtering by using an apparatus consisting of a vacuum chamber made of stainless steel, subjected to vacuum by means of a turbomolecular pump at a pressure lower than $1 \times 10^{-4}$ Pa.

The chamber was provided with two magnetron sources for cylindrical sputtering, both of them connected to a radiofrequency generator (Advanced Energy, 600 W, 13.56 MHz) through a connection box.

The deposition parameters used for all depositions were: target-substrate distance of 14 cm; inert gas Argon with 99.9999% purity; standard flow of Argon $3.33 \times 10^{-7}$ $m^3/s$; radiofrequency power: 30 W for the deposition of Antimony and 60 W for the depositions of Aluminium and Germanium. For the materials used as targets: 99.999% pure Antimony, ACI Alloys), Aluminium (99.999%, Nanovision) and Germanium (99.999%, Kurt J. Lesker) with a very reduced copper content (0.1 mg/kg).

The deposition speed of the different materials was determined by Rutherford Backscattering spectrometry, and the duration of each deposition was determined to obtain the required thicknesses.

For the diffusion steps two lasers were used:
  i) a solid state pulsed laser Nd:YAG, characterized by pulses of 7 ns and a repetition frequency of 10 Hz; the laser light was kept in the UV field (355 nm) and the energy density deposited on each sample during the emission of one single pulse was 400 mJ per $cm^2$;
  ii) an excimer laser KrF (Coherent COMPex 201FI installed in the Department of Physics and Astronomy of University of Padua), capable of emitting light at λ=248 nm, 22 ns with pulse duration on a squared target with uniformity of 2%, by using a repetition frequency of 1 Hz, energy density of 500 mJ/cm$^2$ and 600 mJ/cm$^2$.

FIG. 2 shows the laser radiation geometry used both for Antimony and for Aluminium, with nine partially overlapped spots 4×4 mm$^2$ (only three spots are represented in figure, along the sample diagonal). The partial overlapping between adjacent spots is of 0.7 mm in both directions, and the onboard spots project by 0.3 mm from the sample external edge. The areas exposed to two laser pulses and to four laser pulses are highlighted.

After the laser-annealing step, the surfaces doped with Antimony were cleaned with heated 2-propanole, heated deionized water and hydrofluoric acid, and then a circular electrode made of Gold (Au) with an external guard ring was deposed by sputtering.

Subsequently, both the removal of the layer doped with Antimony in the space between the electrode and the guard ring, and the passivation of all not doped surfaced of the sample were performed in one single solution, by etching with an acid solution 3:1, $HNO_3$ 65%: HF 40% for 10 s, with subsequent quenching in methanol (Erbatron, Carlo Erba). The detector sample was then inflated with dry Nitrogen. During the etching step, the electronic barrier junction was protected by a Kapton tape.

A Secondary Ion Mass Spectrometry (SIMS) was used to analyse samples subjected to laser-annealing, by using Cameca IMS-4f instruments with a flow of $O^{2+}$, to characterize the Aluminium diffusion profiles.

Four-pointed, low-temperature electrical measurements were then carried out according to Van der Pauw procedure. The used experimental device was a Hall-effect measurement system provided by MMR Technologies. It consists in a small vacuum chamber which includes a micrometric refrigeration circuit Joule-Thomson, in which a high pressure in nitrogen $N_2$ (124 bar) is injected and expanded, provided with a ceramic stage as thermal contact with the sample, a capillary for the injection and the nitrogen transportation, a rotary pump and a turbomolecular pump to keep a vacuum level of approximatively $5 \times 10^{-5}$ mbar within the chamber, and at last a temperature control which can be managed remotely. Even a resistor is provided for heating.

With this device, it is possible investigating on a wide temperature range: 77-700 K. The sample is wound in a printed circuit made of Kapton for electrical measurements, which were performed with a meter of electrical parameters Keithley 2600, a matrix switch, a required acquisition software and a permanent magnet (0.5 T) for Hall effect.

A Rutherford Backscattering spectrometry (RBS) was performed by using a Van de Graaf accelerometer with a beam of 2.0 MeV 4He+ at the National Laboratories in Legnaro. RBS was performed with a scattering angle of 160° and with a beam aligned to the crystallographic axis orthogonal to the surface of the substrate under channeling conditions. A high-precision goniometer allowed the alignment of the crystalline axes to implement the RBS-channelling measurements.

The quality of the crystals and the voltage of the re-crystallization layer were determined in a sample selected by high-resolution X ray diffraction (HR-XRD system, Philips MRD X-Pert PRO, provided with a parabolic mirror and a monochromator Bartels), to record the honeycomb mutual maps of asymmetrical reflection (4 4 4).

In order to measure the leakage currents, the detector sample was mounted on a commercial standard cryostat, cooled at 91±1 K. A 1.0 mm-thick Indium foil was inserted between each side of the detector and the respective metal supports, in order to improve the electric contact. The same cryostat was used to determine the features of the detector.

Gamma sources calibrated with $^{241}$Am, $^{152}$Eu and $^{133}$Ba were used for the detector tests. The sources were arranged as close as possible to the external side of the detector to minimize the thickness of absorbing material between the source and the detector, i.e. 1.0 mm of Aluminium for the mounting cover and 1.0 mm of Aluminium for the external end cover.

The detector features were measured by using the source with $^{241}$Am, whereas the other two sources were used for the energy calibration. NIM analog electronics was used for the detector measurements; an ORTEC pre-amplifier (model 137), an ORTEC spectroscopic amplifier (model 672) with a shaping time of 6 µs, a CAEN HV power generator (model N1471A, ±5.5 kV, 300 µA of maximum output, resolution of 5 nA) and an ORTEC Easy-MCA 8K with Maestro software.

The results of these tests are described hereinafter.

With reference to FIG. 3, the RBS-channelling measure is shown collected at the Van de Graaf accelerator at the National Laboratories in Legnaro of the sample made of Germanium with the deposition of the source layer made of Aluminium and the surface layer made of amorphous Germanium. The upper line represents the signal of the retro-diffused ions of Germanium for the sample before the laser treatment. The ion beam is aligned with the substrate axis. It is noted that the signal is subjected to the yield reduction effect typical of channelling only below channel 650, spectrum area which corresponds to Germanium of the substrate. The most superficial portion, above such channel, instead, has a high signal, due to the missed coherent interaction of the beam with the amorphous material. After the laser treatment (lower line in FIG. 3), the whole signal results to be lowered uniformly. This effect is compatible with a re-crystallization of the Germanium atoms in the film during solidification, which originates one single crystal without continuity solution between film and substrate. The measure shows that after the laser treatment, the surface layer made of Germanium transits from an amorphous state to a crystalline state coherent with the substrate. In other words, the material of the surface layer then results to be perfectly integrated in the crystal of the future detector.

FIG. 4 shows the obtained chemical profiles made of Aluminium for a structure with 2 nm of Aluminium and a surface layer of 40 nm of Germanium. 1 pulse and 4 consecutive laser pulses were performed. The total concentration of Aluminium is measured by SIMS. The profile is noted which corresponds to the sample just after deposition of layers: the profile shape is due to the typical depth resolution of the instrument of about 9 nm per decade, not with an inter-diffusion of Aluminium in the growth step. The sample before annealing shows the two-layered structure, with the layer made of Aluminium buried below the surface layer made of Germanium, and well separated from the substrate. After 1 pulse the profile made of Aluminium becomes homogeneous. Each memory of the preceding 2-layered structure disappears. In the light of the results of FIG. 3 it is deduced that the aluminium distributes within a coherent crystalline layer partially consisting of the re-crystallized protective layer and partially of the substrate itself.

The concentration of Aluminium is particularly high (around $10^{21}$ per $cm^3$) and distributes in a reduced thickness (≤150 nm). After 4 laser pulses a limited degrowth in the concentration and an increase in the depth reached by the Aluminium up to approximatively 200 nm is noted.

The total concentration is fundamental information showing the incorporation of Aluminium into Germanium; however, one has to demonstrate that such Aluminium is electrically active, that is in the chemical state suitable to provide gaps to the semiconductor. The Van der Pauw-Hall technique allows to determine an activation level around $3*10^{20}$ at/cm$^3$ for the sample with 1 pulse and almost total for the sample with 4 pulses according to the methods described in Richard L. Petritz. *Theory of an experiment for measuring the mobility and density of carriers in the space-charge region of a semiconductor surface*. Physical Review 110.6 (1958), pp. 1254-1262. ISSN: 0031899X. DOI: 10.1103/PhysRev.110.1254.

More in detail, the horizontal dashed lines in the diagrams of FIGS. 4 and 5 represent the concentration below thereof the Aluminium results to be wholly active for the samples which have received 4 and 1 pulse, respectively.

FIG. 5 shows the same processes and the same characterizations for a sample without surface amorphous layer. As it is noted, the depths involved by the diffusion after laser-annealing are similar to the preceding case, the big difference lies in the amount of Aluminium that diffused and that is placed at lower concentrations: this phenomenon is particularly evident after 4 pulses. Even the activation levels (dashed lines) are much lower. This fact designates a smaller availability of Aluminium presumably due to the interaction of the same with surface impurities or due to a diffusion towards outside the sample (the surface could capture Aluminium). In each case, the fact of spacing out the source of Aluminium from the surface has beneficial effects both in terms of chemical concentration and of electric activation.

Herebelow the characterizations of the most significative three types of prototypes are reported:

1) reference p+ junction, obtained with (standard commercial) Boron implantation;
2) p+ junction, obtained with single deposit of Aluminium and laser annealing; and
3) p+ junction with double source-surface layer made of Aluminium-Germanium and laser annealing.

FIG. 6 shows the spectra obtained by exposing the 3 detectors to a calibrated source of gamma radiation of $^{241}$Am, in the region of photopeak (E=59.54 keV). The spectra are translated by 500 counts for sake of display (they would result to be perfectly overlapped less than the statistical noise).

As it can be noted, all spectra in FIG. 6 can be perfectly overlapped: this result highlights the fact that all three detectors have analogous performances in terms of energy resolution, which results to be approximatively 0.7 keV at 59.54 keV. It is an optimum value for detectors of this type.

One of the tests implemented on the three detectors was aimed at determining the detection effectiveness which is obtained by measuring the frequency course of the detector counts depending upon the applied polarization voltage: when the complete polarization (and then the complete emptying) of the detector is reached, the counting frequency assumes a constant value (plateau) which does not change for additional voltage increases. It was found that the complete polarization of all detectors takes place around 15 Volts: around this value the measured counting frequencies are all equal within 4% (error due to the measurement geometrical reproducibility). This result shows that all three prototypes have the same effectiveness.

A much important parameter allowing to characterize finely the barrier performances of the implemented contacts, in particular from the point of view of the effectiveness in locking the leakage currents of electrons, is the characteristic I-V curve obtained during polarization. The measurement of I-V curve is performed after having connected the detector contacts to a picoammeter without passing by the pre-amplification stages required to collect the signals due to gamma events.

FIG. 7 shows the current course depending upon the reverse polarization voltage (I-V curve) measured for the three prototypes. It is to be noted that the leakage current in any case is low (lower than 1 nA) which is consistent with the optimum resolution obtained by all prototypes. The prototype with Boron contact has the best performance, by keeping a constant current up to 40 V. Of the two samples with Aluminium contact, the prototype obtained with Ge/Al technology approaches very much to the standard, by highlighting very low currents (and comparable to the standard) until the polarization voltage and then by showing only a slight increase with however very low final values, and lower than 2 pA. On the contrary, in case of contact with the single layer of Aluminium, the current growth is more sensitive and the difference with the other two prototypes becomes marked at the highest voltages (almost 3 orders of magnitude at 40 V).

In the light of the preceding measures of electric activation (FIG. 3), this course if very reasonable and can be attributed to a less barrier effectiveness due to the low doping and/or to the presence of structural defects in the not active fraction of Aluminium in the sample with the single layer.

The performed checks allow to conclude that the performances of the method based upon the protective layer can be compared to those of the method obtained by ion implantation and on the contrary much higher than the laser-annealing method which does not provide it. It is to be noted that the leakage current is a fundamental parameter, in many applications and that it is the most stringent feature to characterize the performances of a diode. This fact can be particularly relevant when detectors with bigger sizes requiring higher voltages and areas are produced.

To the above-described doping process a person skilled in the art, with the purpose of satisfying additional and contingent needs, could introduce several additional modifications and variants, however all comprised within the protective scope of the present invention, as defined by the enclosed claims.

The invention claimed is:

1. A doping process of p+ or n+ type for semiconductors, comprising:
   providing a substrate made of semiconductor material;
   depositing on a surface of the substrate made of semiconductor material a thin source layer made of dopant material acting as dopant source;
   depositing on said source layer an additional surface layer of semiconductor material;
   inducing liquefaction of the surface layer at least until the source layer, so as to obtain diffusion of the dopant material;
   cooling down the substrate surface, so as to obtain solidification of the semiconductor material with incorporation of the dopant itself.

2. The doping process according to claim 1, wherein the liquefaction step is implemented by emitting, on the substrate surface, at least one laser pulses.

3. The doping process according to claim 1, wherein the cooling step is so as to obtain a crystalline regrowth of the melt semiconductor material, passing from an amorphous structure to a crystalline structure of the surface layer of semiconductor material.

4. The doping process according to claim 1, wherein the semiconductor material of the substrate and of the surface layer coincide.

5. The doping process according to claim 1, wherein the semiconductor material is Germanium or High-Purity Germanium (HPGe).

6. The doping process according to claim 1, wherein the p+ dopant material is aluminum.

7. The doping process according to claim 1, wherein the thickness of the source layer is comprised in a range between 0.1 nm and 20.0 nm.

8. The doping process according to claim 1, wherein the steps of depositing the source layer and of the surface layer are performed in the same chamber, without intermediate extraction of the substrate.

9. The doping process according to claim 8, wherein the deposition chamber is a vacuum chamber.

10. The doping process according to claim 9, wherein the depositions of the source layer and of the surface layer are implemented by sputtering.

11. The doping process according to claim 1, wherein the deposition of the source layer is implemented by sputtering.

12. The doping process according to claim 1, wherein the thickness of the surface layer is comprised in a range between 0.1 nm and 2.0 µm.

13. The doping process according to claim 1, wherein said step of liquefying the surface layer is completed within a limit time of 400 ns.

14. The doping process according to claim 2, wherein the laser pulses are emitted in the UV field and in the visible light field.

15. The doping process according to claim 14, wherein said laser pulses have a duration of less than 200 ns.

16. The doping process according to claim 14, wherein the laser wavelength is comprised in a range between 200 nm and 700 nm.

* * * * *